United States Patent [19]

Havemann et al.

[11] Patent Number: 5,661,344
[45] Date of Patent: Aug. 26, 1997

[54] POROUS DIELECTRIC MATERIAL WITH A PASSIVATION LAYER FOR ELECTRONICS APPLICATIONS

[75] Inventors: Robert H. Havemann, Garland; Bruce E. Gnade, Dallas; Chih-Chen Cho, Richardson, all of Tex.

[73] Assignee: Texas Instruments Incorporated, Dallas, Tex.

[21] Appl. No.: 476,164

[22] Filed: Jun. 7, 1995

Related U.S. Application Data

[62] Division of Ser. No. 286,761, Aug. 5, 1994, Pat. No. 5,472,913.

[51] Int. Cl.$^6$ .................................................. H01L 51/00
[52] U.S. Cl. .......................... 257/758; 257/642; 257/637; 257/760; 257/759
[58] Field of Search .................................. 257/774, 642, 257/759, 637, 632, 758, 760, 173

[56] References Cited

U.S. PATENT DOCUMENTS

| | | | |
|---|---|---|---|
| 4,406,053 | 9/1983 | Takasaki et al. | 29/588 |
| 4,481,283 | 11/1984 | Kerr et al. | 257/758 |
| 4,652,467 | 3/1987 | Brinker et al. | 427/236 |
| 4,876,217 | 10/1989 | Zdebel | 437/67 |
| 4,987,101 | 1/1991 | Kaanta et al. | 437/927 |
| 5,103,288 | 4/1992 | Sakamoto et al. | 257/758 |
| 5,155,576 | 10/1992 | Mizushima | 257/759 |
| 5,302,551 | 4/1994 | Iranmanesh et al. | 437/195 |
| 5,342,808 | 8/1994 | Brigham et al. | 437/228 |
| 5,364,818 | 11/1994 | Ouellet | 437/195 |
| 5,393,712 | 2/1995 | Rostoker et al. | 437/238 |
| 5,426,330 | 6/1995 | Joshi et al. | 257/752 |
| 5,470,802 | 11/1995 | Gnade et al. | 437/238 |
| 5,488,015 | 1/1996 | Havemann et al. | 437/195 |
| 5,494,858 | 2/1996 | Gnade et al. | 437/231 |
| 5,504,042 | 4/1996 | Cho et al. | 437/247 |

FOREIGN PATENT DOCUMENTS

| | | |
|---|---|---|
| A0 177 845 | 4/1986 | European Pat. Off. . |
| 61-268037 | 11/1986 | Japan . |
| 3-105923 | 5/1991 | Japan . |
| 4-311059 | 11/1992 | Japan . |
| 2 266 181 | 10/1993 | United Kingdom . |

OTHER PUBLICATIONS

J. Fricke and A. Emmerling, J. Am. Ceram. Soc. 75 (1992) 2027 no month.

L. W. Hrubesh, L. E. Keene and V. R. Latorre, J. Materials Res. 8 (1993) 1736 no month.

H. D. Gesser and P. C. Goswami, Chem. Rev. 89 (1989) 765 no month.

S. T. Mayer, R. W. Pekala and J. L. Kaschmitter, J. Electrochem. Soc. 140 (1993) 446 no month.

*Primary Examiner*—Sara W. Crane
*Assistant Examiner*—Alexander Oscar Williams
*Attorney, Agent, or Firm*—James E. Harris; Richard A. Stoltz; Richard L. Donaldson

[57] ABSTRACT

A semiconductor device and process for making the same are disclosed which use porous dielectric materials to reduce capacitance between conductors, while allowing conventional photolithography and metal techniques and materials to be used in fabrication. In one structure, patterned conductors 18 are provided on an interlayer dielectric 10, with a substrate encapsulation layer 31 deposited conformally over this structure. A layer of porous dielectric material 22 (e.g. dried SiO$_2$ gel) is then deposited to substantially fill the gaps between and also cover the conductors. A substantially solid cap layer 14 of a material such as SiO$_2$ is then deposited, followed by a photolithography step to define via locations. Vias are etched through the cap layer, and then through the porous dielectric. A via passivating layer 30 is conformally deposited and then anisotropically etched to clear the bottom of the vias while leaving a passivating liner in the via, preventing the via metal from directly contacting the porous material. A second application of these steps may be used to form a second, overlying structure of patterned conductors 38, encapsulating layer 36, porous dielectric layer 40, and cap layer 42.

9 Claims, 3 Drawing Sheets

POROUS DIELECTRIC MATERIAL WITH A PASSIVATION LAYER FOR ELECTRONICS APPLICATIONS

This is a division of application Ser. No. 08/286,761, filed Aug. 5, 1994, now U.S. Pat. No. 5,472,913, issued Dec. 5, 1995.

CROSS-REFERENCE TO RELATED APPLICATIONS

The following co-assigned U.S. patent applications are hereby incorporate herein by reference:

| TI Case | Ser. No. | Filing Date | Inventor | Title |
|---|---|---|---|---|
| TI-18941 | 08/247195 | 5/20/94 | Gnade et al | A Low Dielectric Constant Material For Electronics Applications |
| TI-19071 | 08/234099 | 4/27/94 | Havemann | Via Formation In Polymeric Materials |
| TI-19072 | 08/246432 | 5/20/94 | Havemann et al | Interconnect Structure with an Integrated Low Density Dielectric |
| TI-19253 | 08/250142 | 5/27/94 | Havemann et al | Two-Step Metal Etch Process For Selective Gap Fill of Submicron Interconnects and Structure For Same |
| TI-19178 | 08/255157 | 6/07/94 | Gnade et al | Porous Composites as a Low Dielectric Constant Material for Electronics Applications |
| TI-18996 | 08/263572 | 6/23/94 | Cho et al | Porous Dielectric Material With Improved Pore Surface Properties For Electronics Applications |

FIELD OF THE INVENTION

This invention relates generally to the fabrication of dielectrics on semiconductor devices, and more particularly to methods for reducing capacitive coupling on a semiconductor device using electrical insulators made of porous dielectric materials.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.5 microns to 0.25 microns can increase power consumption by 30%. Likewise, doubling operational speed generally doubles power consumption. Miniaturization also generally results in increased capacitive coupling, or crosstalk, between conductors which carry signals across the chip. This effect both limits achievable speed and degrades the noise margin used to insure proper device operation.

One way to diminish power consumption and crosstalk effects is to decrease the dielectric constant of the insulator, or dielectric, which separates conductors. Probably the most common semiconductor dielectric is silicon dioxide, which has a dielectric constant of about 3.9. In contrast, air (including partial vacuum) has a dielectric constant of just over 1.0. Consequently, many capacitance-reducing schemes have been devised to at least partially replace solid dielectrics with air.

U.S. Pat. No. 5,103,288, issued to Sakamoto, on Apr. 7, 1992, describes a multilayered wiring structure which decreases capacitance by employing a porous dielectric with 50% to porosity (porosity is the percentage of a structure which is hollow) and pore sizes of roughly 5 nm to 50 nm. This structure is typically formed by depositing a mixture of an acidic oxide and a basic oxide, heat treating to precipitate the basic oxide, and then dissolving out the basic oxide. Dissolving all of the basic oxide out of such a structure may be problematic, because small pockets of the basic oxide may not be reached by the leaching agent. Furthermore, several of the elements described for use in the basic oxides (including sodium and lithium) are generally considered contaminants in the semiconductor industry, and as such are usually avoided in a production environment. Methods described in the '288 patent for creating multilayered wiring structures using porous dielectrics show that all wiring levels which will eventually contain porous dielectric must be formed before any porous dielectric layer is completed. Such radical departures from standard production techniques have often proven to contain many hidden barriers to practical and timely implementation, such that an otherwise good idea (i.e. porous dielectrics) may never see production unless simplifying innovations are made.

SUMMARY OF THE INVENTION

The present invention provides methods for inserting porous structures as dielectric layers in semiconductor devices as well as an overall resulting structure. It is recognized herein that extremely porous dielectric layers (porosity generally greater than 50% and preferably greater than 75%) may advantageously provide a low dielectric constant insulation for decreasing unwanted capacitive coupling on semiconductor devices. This invention describes methods for patterning and integrating such porous layers in an otherwise standard fabrication process (i.e. multiple wiring layers formed generally as sequentially deposited and patterned conducting and insulating layers).

It has now been recognized that porous dielectrics may be etched, substantially anisotropically (i.e. in one direction), by dry processes which anisotropically etch a similar non-porous material. Such a process is believed to generally etches a porous material at a rate which is inversely proportional to the density of the material (e.g. a 50% porous, and therefore 50% dense, material etches at roughly twice the rate of a 100% dense material).

It has also now been recognized that conducting layers should preferably not be formed directly upon a porous layer, because of numerous problems such as filamentation, corrosion, and passivation. Additionally, a metal layer formed directly over such a porous layer may have significantly increased surface area at the porous dielectric to conductor interface, causing capacitance to actually increase. As such, this invention provides for capping and passivation of vias, or through holes, etched in a porous dielectric layer. An additional advantage of the passivation liner, particularly useful when vias are to connect to narrow, high aspect ratio conductors, is an increased via misalignment tolerance, since the liner may narrow a misaligned via to a point where it is aligned. It is believed that this is the first invention to successfully incorporate a porous dielectric which contains vias etched directly through the porous material.

The present invention provides a method for fabricating dielectrics for semiconductor devices with reduced dielectric constant, compared to conventional oxide fabrication techniques, while maintaining compatibility with common semiconductor metal deposition and photolithography materials and techniques. The method comprises forming a layer of patterned conductors on a substrate, where the substrate may be an actual semiconductor substrate or a previous interlayer dielectric. The method may further comprise conformally depositing a substrate encapsulation layer (preferably of silicon dioxide and/or silicon nitride) over exposed portions of the patterned conductors and the substrate. Furthermore, the method comprises covering the patterned conductors and substrate with a porous dielectric layer. The method may further comprise baking the device, before any additional steps, in a substantially oxygen-free atmosphere. The method further comprises depositing a substantially solid insulating cap layer over the porous dielectric layer (preferably of silicon dioxide, silicon nitride, or sublayers of both). The method may further comprise etching one or more vias through the cap layer, as well as through the porous dielectric layer to contact the tops of the patterned conductors. The etch procedure for the porous layer may be different than that used for the cap layer, with reactive ion etching preferred for the porous layer. The method may further comprise depositing a conformal via passivation layer over the cap layer and exposed surfaces within the vias, and anisotropically removing the passivation layer from the bottoms of the vias, thereby creating lined vias for completing electrical connections to the patterned conductors.

A semiconductor device according to the present invention can comprise a layer of patterned conductors formed on a substrate. The device may further comprise a substrate passivation layer conformally deposited over the patterned conductors. The device may further comprise a porous dielectric layer filling spaces between and covering the conductors, and a substantially solid cap layer overlying the porous dielectric layer. The device may further comprise at least one via etched through the cap layer, porous dielectric layer, and substrate passivation layer (if included in the structure), to expose the top surface of at least one patterned conductor. The device may further comprise a passivating layer deposited on the sidewalls of the via, at least where the via passes through the porous dielectric layer. The device may further comprise one or more electrical connections formed by filling the via(s) with a conducting material to electrically connect one or more patterned conductors to a second level of patterned conductors deposited above the cap layer.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

Typical embodiments of the invention are described with a porous dielectric method of depositing a solution, gelling it on the substrate, surface modification, and drying to form a porous dielectric from the wet gel. All steps detailed for this process may not be required in a given embodiment. Furthermore, materials may be substituted in several of the steps to achieve various effects, and processing parameters such as times, temperatures, pressures, and relative concentrations of materials may be varied over broad ranges. In any case, another method which produces a similar porous dielectric layer could be substituted for the described method.

Figure 1A:
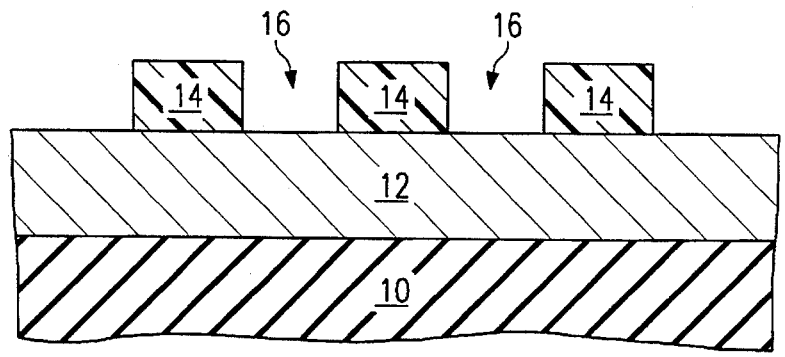
FIGS. 1A–1E are cross-sectional views showing the progressive steps in the fabrication of a layer of patterned conductors, a porous dielectric layer with an overlying cap layer, a via through the cap layer and porous dielectric layer, and the creation of via sidewalls.
Figure 1B:
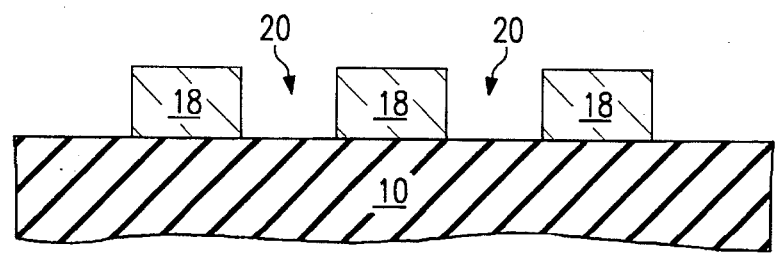
Figure 1C:
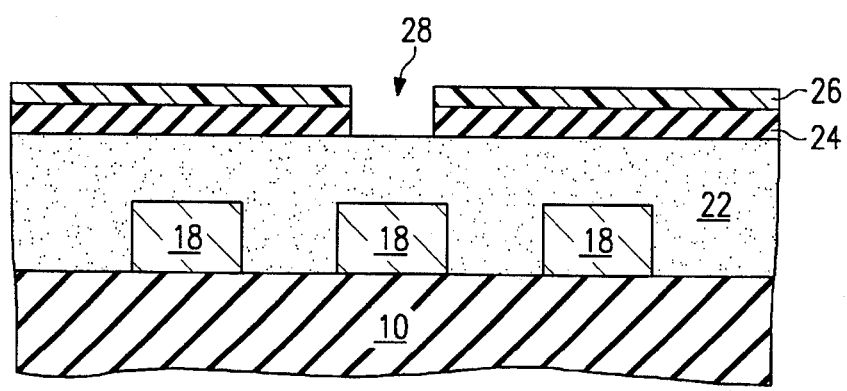

As an introduction, FIGS. 1A–1E illustrate a semiconductor structure at several steps in the formation of an interconnection layer. With reference to FIG. 1A, a conducting layer 12 which may be of aluminum alloyed with a small amount of copper, with a TiN underlayer and overlayer (not shown) is deposited on an insulating layer 10 (e.g. silicon dioxide or a previous level formed according to the present invention). Conducting layer 12 may be connected through insulating layer 10 to an underlying structure (not shown). A layer of photoresist 14 is spun on over conducting layer 12, exposed through a mask pattern and developed, such that the photoresist layer 14 contains gaps 16 where conducting layer 11 is to be removed. Referring now to FIG. 1B, conducting material has been removed using an etching process which removes material below gaps in the photoresist layer to create patterned conductors 18 separated by gaps 20. The photoresist 14 of FIG. 1A has also been stripped and does not appear in FIG. 1B. FIG. 1C shows additional layers added to the structure. A porous dielectric layer 22 fills the gaps 20 of FIG. 1B, as well as covering patterned conductors 18 to a thickness roughly equivalent to the thickness of the conductors themselves (layer 22 generally having a depth measured in gap 20 of at least 150% of conductor thickness and shown as 200% of conductor thickness). This porous layer may, for example, be formed by first depositing and gelling a gel precursor solution (some of which are described in detail in the specific chemical examples) in the gaps between and over conductors 18 to form a wet gel sublayer. The method of application may be, for example, a spin-on technique in a controlled atmosphere which limits solvent evaporation. The precursor may be prepared, for example, by the following 2-step process. First, TEOS stock, a mixture of tetraethylorthosilicate (TEOS), ethanol, water, and HCl, in the approximate molar ratio 1:3:1:0.0007, is prepared by stirring these ingredients under constant reflux at 60 degrees C. for 1.5 hours. Secondly, 0.05M ammonium hydroxide is added to the TEOS stock, 0.1 ml for each ml of TEOS stock. After the solution is applied to the wafer, care should be taken to insure that the thin film does not dry prematurely; preferably, the wafer containing the solution/gel generally remains immersed either in liquid or in a saturated atmosphere at all times prior to the drying stage. The precursor solution may preferably be gelled on the substrate, a process which typically takes from 1 minute to 12 hours, depending on the solution and method of gelling. The wet gel can be allowed time to age, generally about a day (although it may be much shorter), at one or more controlled temperatures. Gelation and aging may preferably be accomplished by letting the device sit in a saturated ethanol atmosphere for approximately 24 hours at about 37 degrees C.

Next, the water may be removed from the wet gel, preferably by immersing the wafer in pure ethanol. In this example, a surface modification step is performed on the wet gel, replacing a substantial number of the molecules on the pore walls with those of another species. Surface modification may be performed, for example, by immersing the wafer in a hexane solution containing about 10% by volume trimethylchlorosilane (TMCS). This surface modification typically replaces reactive surface groups such as hydroxyls and alkoxyls with more stable surface groups such as methyl groups, thereby controlling undesirable condensation reactions (and shrinkage effects) during gel drying. It has been discovered that by controlling the percentage of reactive surface groups replaced during the surface modification, the final shrinkage may be adjusted from the large shinkage typical of an unmodified xerogel (with uncontrolled shrinkage) to a shrinkage of only a few percent, heretofore only achievable with a supercritical aerogel technique. Typically, approximately 30% of the reactive surface groups must be replaced to substantially alleviate densification. Furthermore, the replacement surface species may be chosen because of its wetting properties in combination with specific pore fluids; the surface modification may result in a pore fluid contact angle closer to 90 degrees, which is desirable because of a corresponding decrease in capillary forces in the gel structure during drying. It is believed that the surface modification prevents surface condensation reactions, and may also reduce capillary pressure by changing pore fluid contact angle, thereby allowing pores in the surface modified gel to better survive drying.

After a brief reaction time, the unreacted surface modification compound is usually removed by immersing the wafer in an aprotic solvent (e.g. acetone, hexane) and allowing excess solvent to drain. After this solvent exchange, solvent is finally allowed to evaporate from the wet gel to form porous dielectric layer 22. Preferably, porous layer 22 is dehydroxylated (hydroxyl groups present on the internal pore surfaces are removed) at this point by baking the device in a forming gas (10 vol % $H_2$, 90 vol % $N_2$), preferably at about 450° C. It has been previously recognized that this process may improve the dielectric properties of the porous structure. It is recognized herein that further advantages of dehydroxylation (which tends to remove other surface species as well) may include improvements in controllability and selectivity of the porous dielectric etch process.

A cap layer 24 may then be deposited over porous layer 22, preferably by a low temperature dry technique such as PECVD (plasma enhanced chemical vapor deposition) of TEOS to form a silicon dioxide layer, or a plasma silicon nitride deposition process. In this example, the PECVD TEOS technique has been used so that several important issues related to the use of similar materials for both cap layer 24 and underlying porous layer 22 may be examined. FIG. 1C shows a new layer of photoresist 26 deposited over cap layer 24. A via 28 is shown after mask patterning and developing of photoresist layer 26, and after anisotropic etch of cap layer 24.

In FIG. 1C, an ideally controlled etch of via 28, which was stopped exactly at the boundary between porous and cap layers, is shown. In practice, if both layers are formed from similar materials, both will probably be similarly affected by the cap layer etch, except that porous layer 22 has a density preferably ⅓ to ⅕ that of the cap layer. This translates to a relative etch rate roughly 3 to 5 times higher for the porous material, such that, for example, a 10% overetch of cap layer 24 may actually result in a 50% overetch into the porous layer. To alleviate this problem, materials with a higher selectivity may be chosen, the cap layer may be kept as thin as possible, and planarizing cap layers (which may result in varying cap layer thickness across a wafer) should probably be avoided.

Figure 1D:
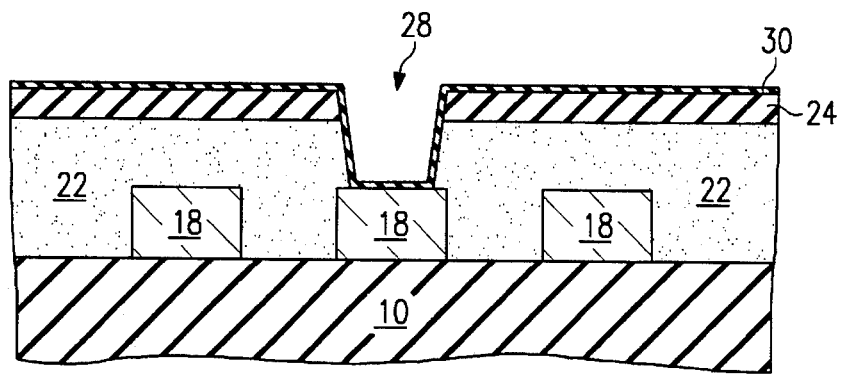
Figure 1E:
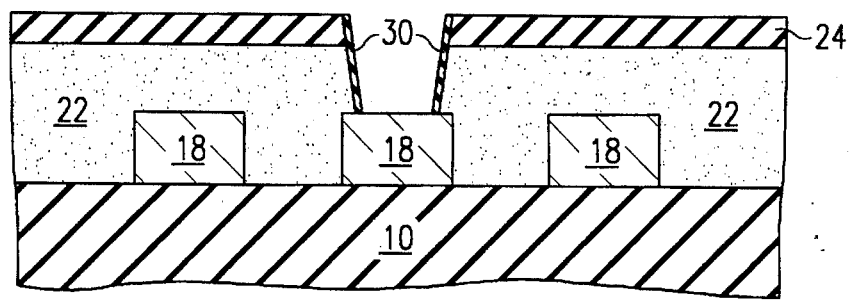

FIG. 1D illustrates the device after photoresist 26 has been stripped and via 28 has been etched through dielectric layer 22 to conductor 18. Such an etch may preferably be carried out using reactive ion etching (RIE) and standard $SiO_2$ etchants for TEOS-based porous dielectrics, with etch rates adjusted appropriately for a given porosity. This figure further shows a via passivation layer 30 applied conformally over the exposed surfaces of the device. Preferably, via passivation layer 30 is constructed of a material similar to cap layer 24 (PECVD TEOS deposition of silicon dioxide for this example), although this is not required. Finally, FIG. 1E shows the via passivation layer 30 remaining only on the via sidewalls, after an anisotropic etch has been used to remove passivation material from the bottom of the via and from the top of the hard mask. This configuration is desirable because it provides decreased capacitive coupling, while maintaining standard dielectric surface materials such as oxides and nitrides for subsequent via metallization, photolithography, and the like.

Figure 2A:
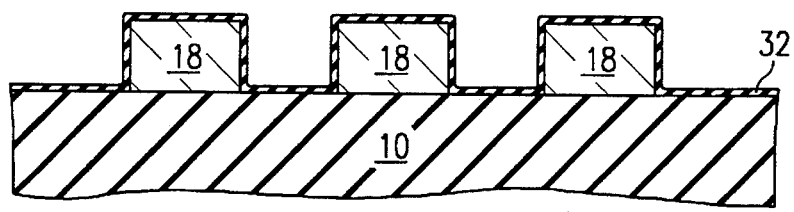
FIGS. 2A–2C are cross-sectional views of a second embodiment containing a racial/substrate encapsulation layer over the patterned conductors and employing a portion of the cap layer as a sacrificial layer to clear the bottom of the via.
Figure 2B:
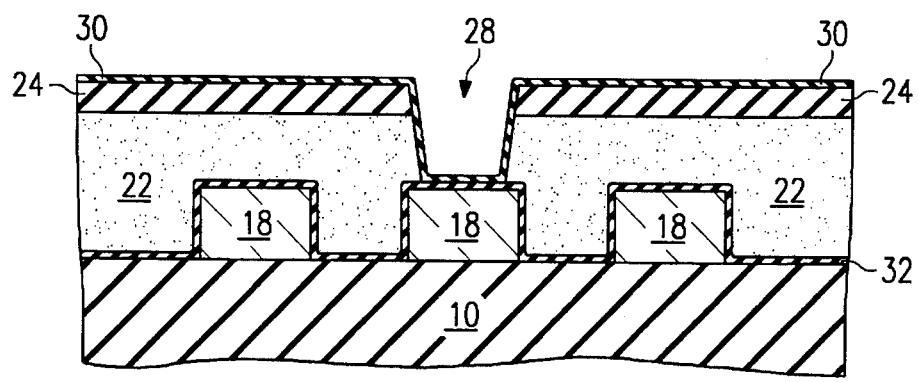
Figure 2C:
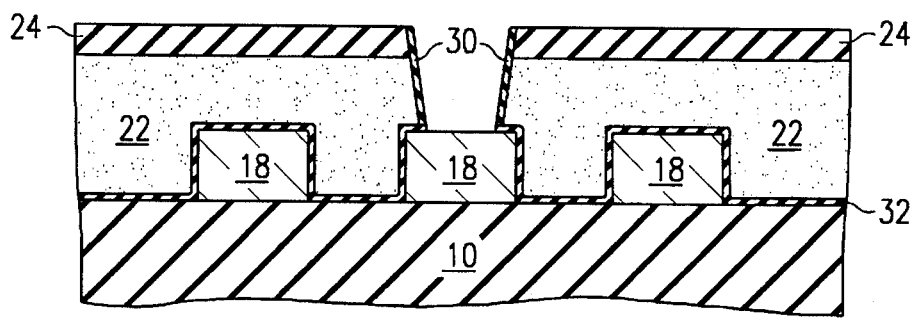

FIGS. 2A–2C show a second embodiment which includes a substrate encapsulation layer 32 deposited conformally over the patterned conductors 18 and substrate 10. FIG. 2A shows the structure after patterning of the conductors and deposition of encapsulation layer 32 (e.g. silicon dioxide). Steps similar to those of the first embodiment are then performed to construct the cross-section of FIG. 2B. This embodiment differs in that the bottom of via 28 is now typically obstructed by both substrate encapsulation layer 32 and via passivation layer 30. Clearing the bottom of the via utilizes an anisotropic etch which can remove both obstructing layers. Since only via passivation layer 30 exists on top of cap layer 24, the cap layer may be deposited with additional thickness designed to be sacrificial; that is, a portion of the cap layer may be removed during etching of the passivating layers. An additional advantage afforded by this embodiment is that porous dielectric layer 22 may be completely enclosed by the passivating and encapsulating material, such that conducting material is completely isolated from porous dielectric material.

Figure 3A:
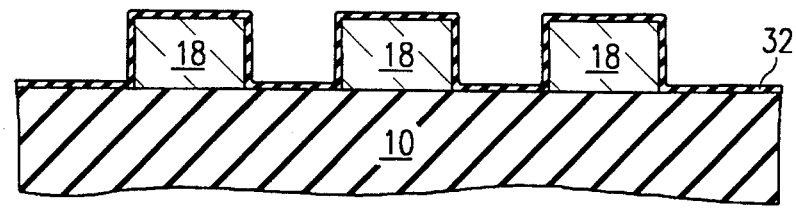
FIGS. 3A–3C are cross-sectional views of another embodiment containing a similar encapsulation layer, but employing a double hard mask technique to clear the bottom of the via.
Figure 3B:
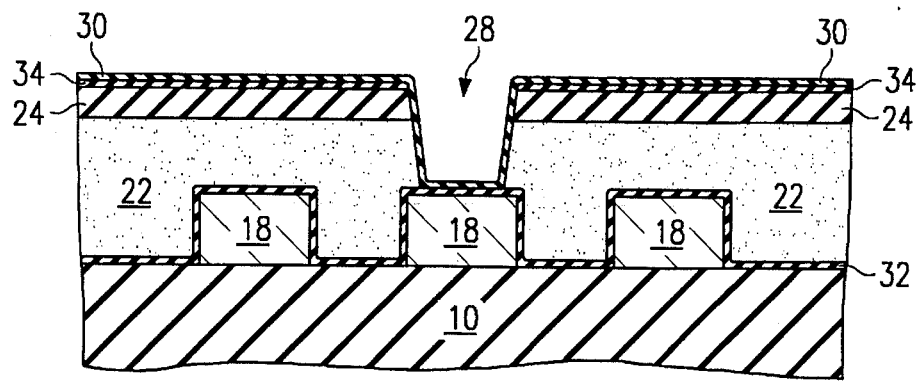
Figure 3C:
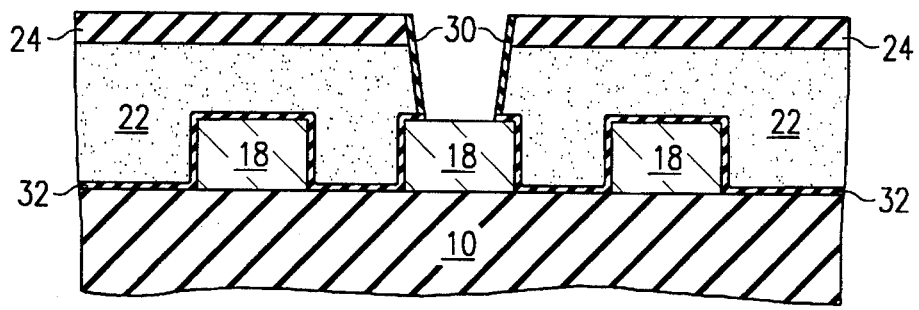

Another method which may be used with a substrate encapsulation layer is depicted in FIGS. 3A–3C FIG. 3A is identical to FIG. 2A, but FIG. 3B shows a cap layer 24 covered by a hard mask layer 34 which is formed of a material resistant to the passivation/encapsulation layer etch. One choice may be a silicon nitride hard mask, if for example, passivating layer 30 and encapsulation layer 32 are constructed of primarily silicon dioxide. This embodiment may require an additional etch step during via opening to remove hard mask layer 34 from the via opening. After via etching of hard mask layer 34, cap layer 24, and dielectric layer 22, via passivation layer 30 is formed to directly overlay hard mask layer 34 instead of cap layer 24. The anisotropic etch to clear the bottom of via 28 now will remove passivation layer 30 from at least the top surfaces of hard mask layer 34. The hard mask layer then acts as an etch stop to prevent etching into cap layer 24, although the tops of the passivation layer 30 lining the via sidewalls are not protected from the etch. After the bottom of via 28 is cleared, hard mask 34 may be left in place. As an alternative, the hard mask may be removed by a selective etch to complete the structure of FIG. 3C. Although not shown, such a hard mask technique may also be used as a thin etch stop at the bottom of cap layer 24 to prevent the cap layer etch from penetrating deeply into the porous layer.

Figure 4:
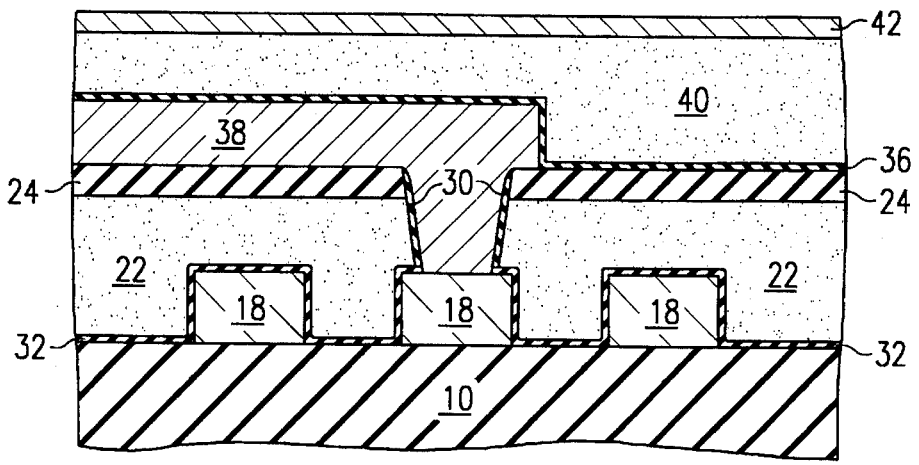
FIG 4 is a cross-sectional view of a two-level embodiment, wherein a filled via is shown electrically connecting conductors on two conductor layers, with both layers constructed using a porous dielectric/overlying cap layer technique.

FIG. 4 shows a cross-section of an embodiment of the invention which illustrates how the various features and advantages of the invention may be employed on multiple layers of patterned conductors. An intermediate structure similar to that of FIG. 2C is built upon by first adding a second layer of patterned conductors 38 above cap layer 24 and in via 28. This layer may be formed by depositing several sublayers (TiN/AlCu alloy/TiN, for example) of conducting material over the structure and patterning this material in a manner similar to the formation of conductors 18. After patterning of the second conducting layer, a second substrate encapsulation layer 36 is deposited over the exposed surfaces of cap layer 24 and second conductor layer 38, followed by a second porous dielectric layer 40 and a second cap layer 42. If connections to yet another overlying layer of conductors (not shown) is desired, via formation on the second conducting layer may then proceed according to one of the methods of the invention.

The following table provides an overview of some embodiments cross-referenced to the drawings.

| Drawing Element | Preferred or Specific Examples | Generic Term | Other Alternate Examples |
|---|---|---|---|
| 10 | SiO$_2$ | Substrate | Other oxides, P-glass, silicon nitride |
| 18,38 | AlCu alloy with TiN underlayer and overlayer | Patterned conductors | Al, Cu, Mo, W, Ti, alloys of these, polysilicon, silicides, nitrides, carbides |
| 14,26 | | Photoresist | |
| 22,40 | Surface-modified dried gel | Porous dielectric layer | Supercritically-dried aerogel, other fine-pored porous dielectrics |
| 24,42 | Silicon dioxide | Cap layer | Doped SiO$_2$, P-glass, silicon nitride |
| 30 | Silicon dioxide | Via passivation layer | Other oxides, silicon nitride, silicon oxynitride |
| 32,36 | Silicon dioxide | Substrate encapsulation layer | Other oxides, silicon nitride, silicon oxynitride |
| 34 | Silicon nitride | Hard mask layer | Silicon oxynitride |

The invention is not to be construed as limited to the particular examples described herein, as these are to be regarded as illustrative, rather than restrictive. The invention is intended to cover all processes and structures which do not depart from the spirit and scope of the invention. For example, the invention is primarily directed to integrating a porous dielectric layer into an otherwise standard semiconductor device, and such a layer may be used in many semiconductor device structures other than the specific structures shown herein. Properties of some of the specific examples may be combined without deviating from the nature of the invention.

What is claimed is:

1. A semiconductor device which comprises:

(a) a layer of patterned conductors formed on a substrate;

(b) a substrate passivation layer conformally deposited over said patterned conductors;

(c) a porous dielectric layer filling spaces between and coveting said conductors;

(d) a substantially solid cap layer overlying said porous dielectric layer;

(e) at least one via etched through said cap layer, said porous dielectric layer, and said substrate passivation layer to expose a top surface of at least one of said patterned conductors; and (f) a passivating layer deposited on the sidewalls of said via where said via passes through said porous dielectric layer.

2. The device of claim 1 further comprising an electrical connection formed by filling said via with a conducting material, said electrical connection being connected to one of said patterned conductors.

3. The device of claim 2, further comprising a second level of patterned conductors deposited on said cap layer.

4. The device of claim 1, wherein said porous dielectric layer comprises a dried gel.

5. A semiconductor device which comprises:

a layer of patterned conductors formed on a substrate;

a porous dielectric layer filling spaces between and coveting said conductors;

a substantially solid cap layer overlying said porous dielectric layer;

at least one via etched through said cap layer and said porous dielectric layer, thereby exposing a top surface of at least one of said patterned conductors; and a passivating layer deposited on the sidewalls of said via where said via passes through said porous dielectric layer.

6. The device of claim 5, further comprising a conductive material deposited in said via.

7. A semiconductor device which comprises:

a porous dielectric layer formed on a substrate;

a substantially solid cap layer overlying said porous dielectric layer;

at least one hole etched through said cap layer and said porous dielectric layer; and a passivating layer deposited on the sidewalls of said hole where said hole passes through said porous dielectric layer.

8. The device of claim 7, further comprising a conductive material deposited in said hole.

9. The device of claim 7, wherein said porous dielectric layer comprises added gel.

* * * * *